United States Patent
Lim

[19]

[11] Patent Number: 5,909,625
[45] Date of Patent: Jun. 1, 1999

[54] METHOD FOR FORMING LAYER OF HEMISPHERICAL GRAINS AND FOR FABRICATING A CAPACITOR OF A SEMICONDUCTOR DEVICE

[75] Inventor: Chan Lim, Kyoungki-do, Rep. of Korea

[73] Assignee: Hyundai Electronics Industries Co., Ltd., Ichon-Shi, Rep. of Korea

[21] Appl. No.: 08/871,842

[22] Filed: Jun. 9, 1997

[30] Foreign Application Priority Data

Jun. 24, 1996 [KR] Rep. of Korea ............... 96-23262

[51] Int. Cl.⁶ ........................................ H01L 21/20
[52] U.S. Cl. ........................................ 438/398
[58] Field of Search ........................ 438/398, 396, 438/397, 694, 697, 704

[56] References Cited

U.S. PATENT DOCUMENTS

| | | |
|---|---|---|
| 5,340,765 | 8/1994 | Dennison et al. . |
| 5,723,379 | 3/1998 | Watanabe et al. ............... 438/398 |
| 5,759,262 | 6/1998 | Weimer et al. ............... 117/18 |

FOREIGN PATENT DOCUMENTS

| | | |
|---|---|---|
| 55-121 653 | 9/1980 | Japan . |
| 60-247 928 | 12/1985 | Japan . |
| 61-173 132 | 8/1986 | Japan . |
| 63-283 028 | 11/1988 | Japan . |
| 3-272 165 | 12/1991 | Japan . |
| 5-110 022 | 4/1993 | Japan . |
| 7-014 797 | 1/1995 | Japan . |
| 8-032 034 | 2/1996 | Japan . |
| 9-017 766 | 1/1997 | Japan . |
| 277 159 | 6/1996 | Taiwan . |

Primary Examiner—Charles Bowers
Assistant Examiner—Craig Thompson
Attorney, Agent, or Firm—Thelen Reid & Priest, L.L.P.

[57] ABSTRACT

A method for forming a layer of hemispherical silicon grains having a desired density and a desired shape in order to increase the surface area of the storage electrode of a capacitor. The method involves the formation of a thin oxide film over an under silicon layer to be formed with hemispherical silicon grains, so that the formation of those hemispherical silicon grains can be carried out in such a manner that the hemispherical silicon grains have a desired density and a desired shape under given conditions irrespective of whether or not the under silicon layer is doped with impurity ions and of the crystalline structure of the under silicon layer.

6 Claims, 2 Drawing Sheets

METHOD FOR FORMING LAYER OF HEMISPHERICAL GRAINS AND FOR FABRICATING A CAPACITOR OF A SEMICONDUCTOR DEVICE

BACKGROUND OF THE INVENTION

1. Field of the Invention

The present invention relates to a method for forming a layer of hemispherical grains and for fabricating a capacitor of a semiconductor device in the fabrication of a highly integrated semiconductor device, and more particularly to a method for forming a layer of hemispherical grains having a desired density and a desired shape in order to increase the surface area of the storage electrode of a capacitor.

2. Description of the Prior Art

The recent high integration trend of semiconductor devices inevitably involves a reduction in cell dimension. For this reason, it is necessary to form capacitors having a large capacitance while reducing topology. In the case of a dynamic random access memory (DRAM) device constituted by one transistor and one capacitor, in particular, it is important to increase the capacitance of the capacitor. In order to achieve an increase in capacitance, various methods have been proposed concerning the use of a material exhibiting a high dielectric constant, the use of a dielectric film having a small thickness and the use of a lower electrode having an increased surface area. Although various materials, such as $Ta_2O_5$, $TiO_2$ or $SrTiO_3$, have been proposed as the dielectric material exhibiting a high dielectric constant, their reliance and thin film characteristics have not been confirmed. The use of a dielectric film having a reduced thickness results in the easy damage of the dielectric film occurring during an operation of the semiconductor device using the dielectric film.

In order to increase the surface area of a storage electrode, various structures have also been proposed. For example, they include a stack structure, a fin structure and a cylinder structure.

For the stack and cylinder structures, a method has also been proposed, in which a layer of hemispherical grains are formed on the surface of a storage electrode in order to increase the surface area of the storage electrode.

In this case, the shape and density of hemispherical silicon grains may vary in accordance with the condition of a silicon layer which is used as an underlayer for the growth of those hemispherical silicon grains. For this reason, it is necessary to vary the condition for the formation of such hemispherical silicon grains in accordance with the concentration of impurity ions doped in the under silicon layer and the crystalline structure of the under silicon layer. However, this is troublesome. If no variation in the process condition for the formation of hemispherical silicon grains is made when the condition for the formation of the under silicon layer varies, it is then difficult to obtain desired density and shape of hemispherical silicon grains.

SUMMARY OF THE INVENTION

An objective of the invention is to provide a method for forming a layer of hemispherical silicon grains, which involves the formation of a thin oxide film over an under silicon layer to be formed with hemispherical silicon grains, so that the formation of those hemispherical silicon grains can be carried out in such a manner that the hemispherical silicon grains have a desired density and a desired shape under given conditions irrespective of whether or not the under silicon layer is doped with impurity ions and irrespective of the crystalline structure of the under silicon layer.

In accordance with one aspect of the present invention, a method for forming a layer of hemispherical silicon grains over an under silicon layer is provided and comprises the steps of: removing a natural oxide film existing on the under silicon layer; forming a thin oxide film over the under silicon layer; and forming a layer of hemispherical silicon grains over the thin oxide film.

In accordance with another aspect of the present invention, a method for fabricating a capacitor of a semiconductor device is provided and comprises the steps of: forming a planarizing insulating film over a semiconductor substrate, and forming a contact hole in the insulating film in accordance with an etch process using a storage electrode contact mask; depositing a polysilicon layer for a storage electrode over the resulting structure obtained after the formation of the contact hole, and patterning the polysilicon layer in accordance with an etch process using a storage electrode mask, thereby forming a polysilicon layer pattern; removing a natural oxide film existing on the polysilicon layer pattern; surface-processing the polysilicon layer pattern using a solution containing $NH_4OH$, $H_2O_2$ and $H_2O$ in a desired ratio, thereby forming a thin oxide film having a uniform thickness over the polysilicon layer pattern; forming a layer of hemispherical silicon grains over the oxide film; removing unnesessary hemispherical silicon grains by using storage electrode mask; and sequentially forming a dielectric film and a polysilicon layer for a plate electrode over the hemispherical silicon grain layer.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
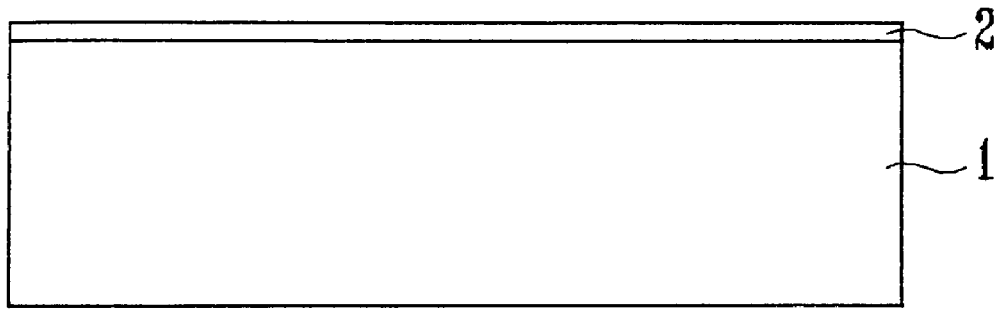
FIGS. 1 and 2 are sectional views respectively illustrating a method for forming a layer of hemispherical silicon grains in accordance with an embodiment of the present invention.
Figure 2:
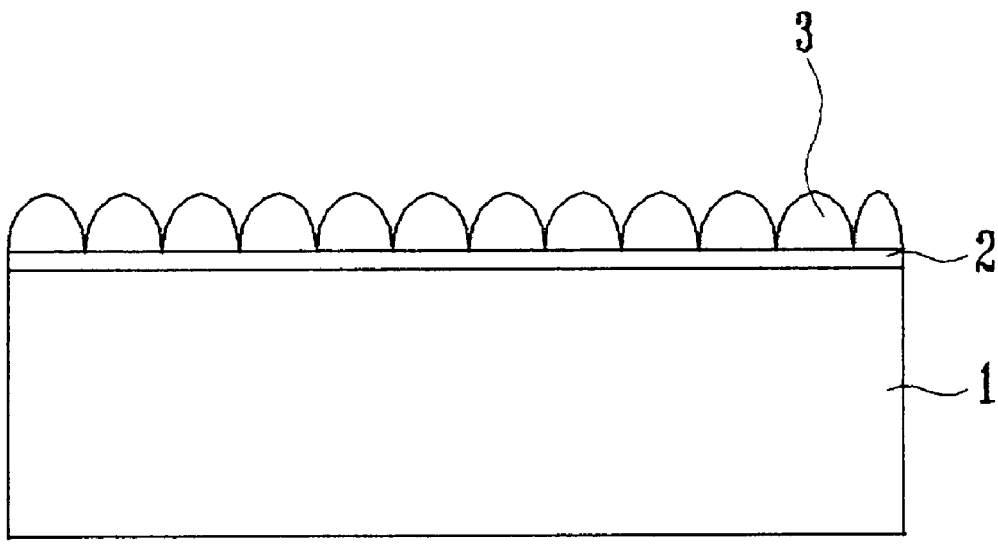

FIGS. 1 and 2 illustrate sequential steps of a method for forming a layer of hemispherical silicon grains in accordance with an embodiment of the present invention, respectively.

In accordance with this method, an underlayer 1 such as a polysilicon or amorphous silicon layer is first prepared. Removal of a natural oxide film (not shown) formed over the underlayer 1 is then carried out using a solution containing hydrofluorine (HF) and $H_2O$. A thin oxide film having a uniform thickness is then formed over the underlayer 1 using a mixed solution of $NH_4OH$ and $H_2O_2$, as shown in FIG. 1.

The removal of the natural oxide film may be achieved using HF vapor formed by spraying HF and $H_2O$ in place of the solution containing HF and $H_2O$. A buffer oxide etchant containing HF and $NH_4F$ may also be used.

The formation of the thin oxide film 2 may be carried out under the condition in which the mixed solution of $NH_4OH$ and $H_2O_2$ is maintained at a temperature of 50° C. or less.

A mixed solution of $HNO_3$ and $H_2O_2$ may be used in place of the mixed solution of $NH_4OH$ and $H_2O_2$. The oxide film 2 has a very weak structure because it is formed over the polysilicon or amorphous silicon layer. Where the underlayer, which is a mono-crystalline silicon substrate, is processed using the mixed solution of $NH_4OH$ and $H_2O_2$ at a temperature of 50° C. or less while the oxide film has a thickness of less than about 15 Å, it is possible to grow silicon grains over the underlayer 1 in such a manner that they are integral with the underlayer 1. In this case, an integral structure for a storage electrode is obtained.

Thereafter, a layer 3 of hemispherical silicon grains is formed to a thickness of 1,000 Å or less over the oxide film 2 at a deposition temperature of 550 to 585° C. in a furnace, as shown in FIG. 2. The loading of the wafer is carried out at a temperature of 400° C. or less under the condition in which $N_2$ gas has been supplied to the furnace.

The reason why the oxide film 2, which is formed using a chemical process, is used in place of the natural oxide film naturally grown over the underlayer 1 is that it has a uniform surface enabling the formation of hemispherical silicon grains 3 at a density larger and more uniform than that when using the natural oxide film.

Natural oxide film may be formed on only a portion of the underlayer in accordance with the surface condition of the underlayer. Such a natural oxide film may be thickened where its wafer is loaded in a furnace at a high temperature. In this case, the formation of hemispherical silicon grains may be carried out non-uniformly. Furthermore, the thick oxide film serves to electrically insulate the hemispherical silicon grains from the underlayer. As a result, it is improper to practically use the resulting storage electrode.

It is noted that where the hemispherical grain layer 3 is grown over the thin oxide film 2 formed over the underlayer 1 in accordance with the present invention, it can be electrically connected to the underlayer 1.

Figure 3:
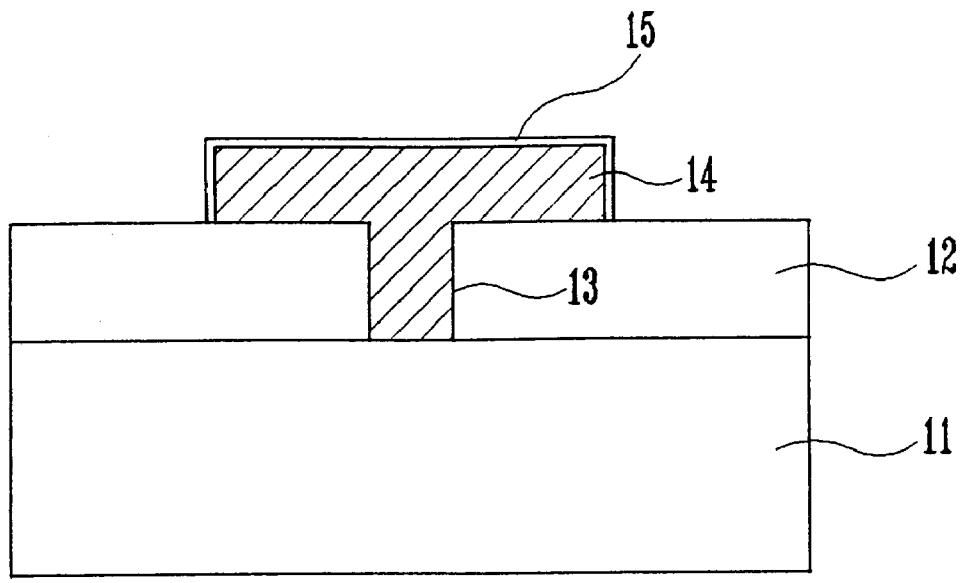
FIGS. 3 and 4 are sectional views respectively illustrating sequential steps of a method for fabricating a capacitor provided with a layer of hemispherical silicon grains in accordance with another embodiment of the present invention.
Figure 4:
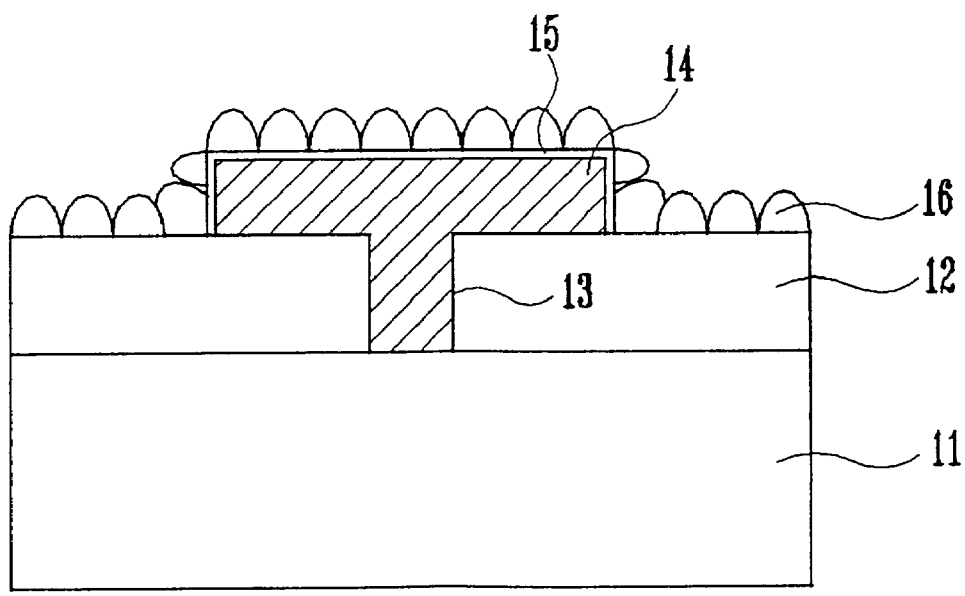

FIGS. 3 and 4 are sectional views showing the method of fabricating a capacitor of a semiconductor device respectively illustrating sequential steps of a method for forming a layer of hemispherical silicon grains over a thin oxide film formed over the surface of a storage electrode having a stack structure in accordance with another embodiment of the present invention.

In accordance with this method, a planarizing insulating film 12 is first formed over a semiconductor substrate 11, as shown in FIG. 3. The insulating film 12 is etched at a desired portion thereof in accordance with an etch process using a storage electrode contact mask, thereby forming a contact hole 13. A polysilicon layer for a storage electrode is then deposited over the resulting structure. The polysilicon layer is then patterned in accordance with an etch process using a storage electrode mask, thereby obtaining a polysilicon layer pattern 14. Thereafter, removal of a natural oxide film (not shown) formed on the polysilicon layer pattern 14 is carried out using a solution containing HF and $H_2O$.

The polysilicon layer pattern 14 is then surface-processed using a solution containing $NH_4OH$, $H_2O_2$ and $H_2O$ in a desired ratio.

As a result, a uniform oxide film 15 is formed over the surface of the polysilicon layer pattern 14.

Subsequently, a layer 16 of hemispherical silicon grains is formed with thickness of 1,000 Å or less over the oxide film 15 at a deposition temperature of 550 to 585° C. in a furnace, as shown in FIG. 4.

The loading of the wafer is carried out at a temperature of 400° C. or less under the condition that $N_2$ gas has been supplied in the furnace.

The resulting structure is then subjected to well-known subsequent processes required for the formation of a capacitor electrode. That is, the hemispherical silicon grain layer 16 is partially removed at its portion existing at an unnecessary region in accordance with an etch process using the storage electrode mask. A dielectric film is then formed over the resulting structure. Finally, a polysilicon layer for a plate electrode is deposited over the dielectric film.

As apparent from the above description, the present invention provides a method for forming a layer of hemispherical silicon grains, which involves the formation of a thin oxide film over an under silicon layer to be formed with hemispherical silicon grains, so that the formation of those hemispherical silicon grains can be carried out in such a manner that the hemispherical silicon grains have a desired density and a desired shape irrespective of whether or not the under silicon layer is doped with impurity ions and irrespective of the crystalline structure of the under silicon layer. Accordingly, an improvement in reproducibility is obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device, comprising the steps of:

forming a planarizing insulating film over a semiconductor substrate, and forming a contact hole in the insulating film in accordance with an etch process using a storage electrode contact mask;

depositing a polysilicon layer for a storage electrode over the resulting structure obtained after the formation of the contact hole, and patterning the polysilicon layer in accordance with an etch process using a storage electrode mask, thereby forming a polysilicon layer pattern;

removing a natural oxide film existing on the polysilicon layer pattern;

surface-processing the polysilicon layer pattern using a solution containing $NH_4OH$, $H_2O_2$ and $H_2O$, thereby forming a thin oxide film having a uniform thickness over the polysilicon layer pattern;

forming a layer of hemispherical silicon grains over the oxide film;

removing unnecessary hemispherical silicon grains by using storage electrode mask; and sequentially forming a dielectric film and a polysilicon layer for a plate electrode over the hemispherical silicon grain layer.

2. The method in accordance with claim 1, wherein the hemispherical silicon grain layer is formed:

to a thickness of 1,000 Å or less at a deposition temperature of 550 to 585° C.

3. The method in accordance with claim 1, wherein:

the removal of the natural oxide film is carried out using a solution of hydrofluorine or $H_2O$.

4. The method in accordance with claim 1, wherein:

the removal of the natural oxide film is carried out using hydrofluorine vapor which is formed by spraying hydrofluorine and $H_2O$.

5. The method in accordance with claim 1, wherein:

the removal of the natural oxide film is carried out using a buffer oxide etchant containing hydrofluorine and $NH_4F$.

6. The method in accordance with claim 1, wherein:

the formation of the thin oxide film is carried out using an $HNO_3$ solution instead of the $NH_4OH$ solution.

* * * * *